United States Patent
Baba

[11] Patent Number: 5,877,658
[45] Date of Patent: Mar. 2, 1999

[54] PHASE LOCKED LOOP

[75] Inventor: Mitsuo Baba, Tokyo, Japan

[73] Assignee: NEC Corporation, Tokyo, Japan

[21] Appl. No.: 984,248

[22] Filed: Dec. 3, 1997

[30] Foreign Application Priority Data

Dec. 5, 1996 [JP] Japan ................................. 8-324920

[51] Int. Cl.[6] .............................. H03L 7/085; H03L 7/089
[52] U.S. Cl. .............................. 331/18; 331/1 A; 331/25; 327/156; 327/157; 327/159; 327/7
[58] Field of Search .................. 331/1 A, 16–18, 331/23, 25; 327/105–107, 156–159, 2, 3, 7–12; 455/260

[56] References Cited

U.S. PATENT DOCUMENTS

| | | |
|---|---|---|
| 4,023,116 | 5/1977 | Alfke et al. . |
| 5,436,596 | 7/1995 | Folmer ................................. 331/18 X |
| 5,699,387 | 12/1997 | Seto et al. . |

FOREIGN PATENT DOCUMENTS

| | | |
|---|---|---|
| 62-23620 | 1/1987 | Japan . |
| PCT WO95/ 34127 | 12/1995 | WIPO . |

OTHER PUBLICATIONS

Patent Abstract of Japan, vol. 011, No. 275 (E–537), 5 Sep. & JP No. 62 076324 A (Japan Radio Co Ltd.), 8 Apr. 1987.
Patent Abstract of Japan, vol. 096, No. 012, 26 Dec. 1996 & JP 08 213905 A (Hitachi Ltd), 20 Aug. 1996.

*Primary Examiner*—David Mis
*Attorney, Agent, or Firm*—Scully, Scott, Murphy & Presser

[57] ABSTRACT

A phase locked loop comprises a voltage controlled oscillator, a 1/n frequency demultiplier, a phase comparator, and a modulation circuit. The phase comparator is supplied with a first signal which varies according to a reference clock signal and a second signal which varies according to a feedback signal supplied from the 1/n frequency demultiplier, executes phase comparison between the two signals, and controls the oscillation frequency of the voltage controlled oscillator by varying a control voltage by outputting an up-control signal or a down-control signal depending on phase difference between the signals. The modulation circuit generates the first signal by periodically modulating the reference clock signal with a shift width which is larger than the dead zone width of the phase comparator, and supplies the phase comparator with the first signal. Preferably, a ½ delay circuit is provided between the 1/n frequency demultiplier and the phase frequency comparator, for delaying the feedback signal by half the shift width. According to the phase locked loop, perfectly linear characteristic around the stationary state and elimination of stationary phase difference are realized.

14 Claims, 11 Drawing Sheets

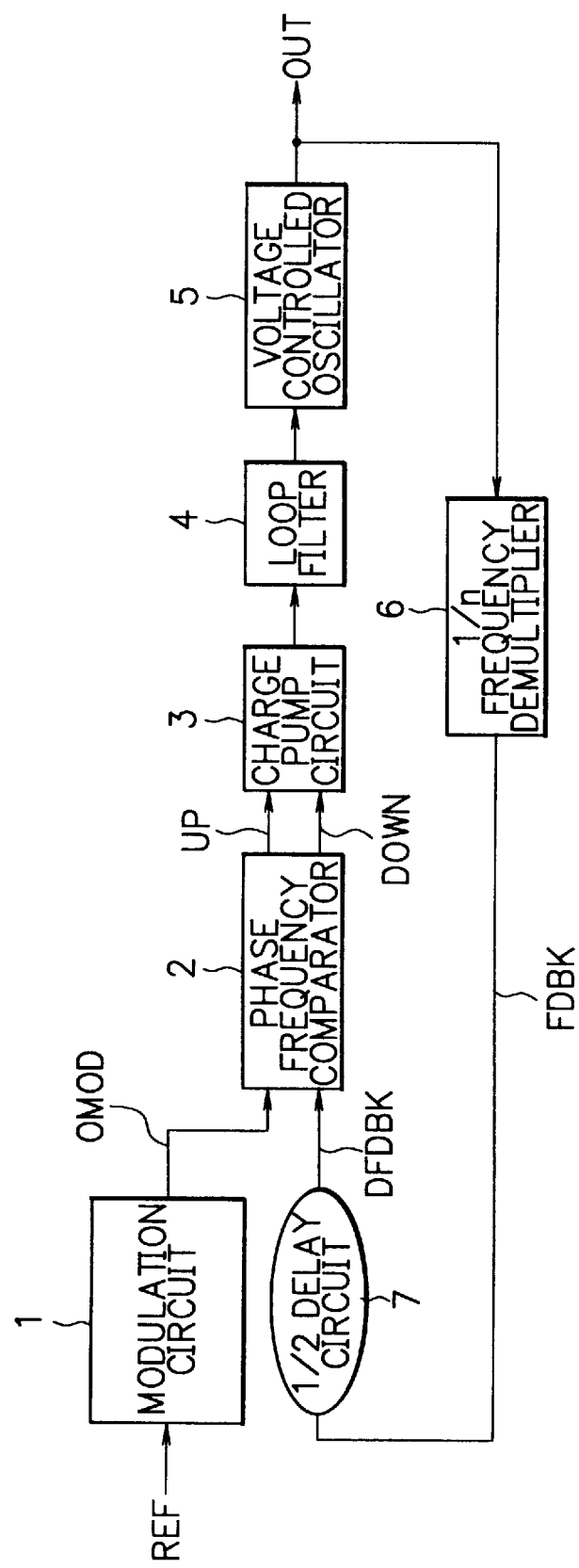
F I G. 10

PHASE LOCKED LOOP

BACKGROUND OF THE INVENTION

The present invention relates to a phase locked loop, and in particular, to a phase locked loop by which effects of a dead zone of a phase comparator included in the phase locked loop can be eliminated.

DESCRIPTION OF THE RELATED ART

Phase locked loops are utilized in various kinds of devices such as demodulators in radio wave receivers etc. A general phase locked loop comprises components such as a voltage controlled oscillator, a 1/n frequency demultiplier, a phase comparator, a loop filter, etc. The voltage controlled oscillator generates an output pulse signal with a frequency which varies according to a control voltage supplied from the loop filter. The 1/n frequency demultiplier outputs a feedback signal which is generated by demultiplying the output pulse signal by n. The phase comparator is supplied with a reference clock signal and the feedback signal, executes phase comparison between the two signals, and varies an electric charge stored in the loop filter by outputting an up-control signal or a down-control signal depending on phase difference between the reference clock signal and the feedback signal. The loop filter controls the oscillation frequency of the voltage controlled oscillator by outputting the control voltage which varies according to the electric charge stored in itself. In the stationary state where the phase locked loop is phase locked, the frequency of the output pulse signal which is outputted by the phase locked loop becomes n times the frequency of the reference clock signal which is supplied to the phase comparator.

However, a phase comparator generally involves a dead zone around phase difference zero, and output of the up-control signal or the down-control signal is not correctly executed by the phase comparator when the phase difference between the reference clock signal and the feedback signal is in the dead zone. Consequently, output jitters occur in the output pulse signal due to the dead zone of the phase comparator, since the phase difference between the two signals lies in the dead zone in the stationary state where the phase locked loop is phase locked and control of the phase locked loop is not executed until the phase difference exceeds the width of the dead zone.

Meanwhile, there are proposed some types of phase locked loops in order to eliminate the output jitters due to the dead zone of the phase comparator. For example, in a phase locked loop which is disclosed in Japanese Patent Application Laid-Open No. SHO62-23620, one of two input signals supplied to the phase comparator is differentiated and a pulse signal which has a predetermined pulse width is generated according to non-zero value of the differentiated input signal, i.e. according to rising (or falling) edge of the input signal. The value of the pulse signal is added to input of the loop filter, thereby bias is given to the control voltage of the voltage controlled oscillator which is outputted by the loop filter, and consequently, the phase locked loop is phase locked with non-zero phase difference between the two input signals to the phase comparator. By the phase locked loop, the phase comparator is allowed to operate outside its dead zone, and the output jitters due to the dead zone of the phase comparator can be avoided. However, due to the non-zero phase difference between the two input signals to the phase comparator, the phase locked loop is necessitated to have a stationary phase difference, i.e. phase difference between input and output of the phase locked loop in the stationary state. Therefore, use of such phase locked loops in devices which do not allow the stationary phase difference is impossible.

SUMMARY OF THE INVENTION

It is therefore the primary object of the present invention to provide a phase locked loop in which the output jitters due to the dead zone of the phase comparator are effectively avoided.

Another object of the present invention is to provide a phase locked loop in which the stationary phase difference is eliminated.

In accordance with the present invention, there is provided a phase locked loop comprising a voltage controlled oscillator, a 1/n frequency demultiplier, a phase comparator, and a modulation circuit. The voltage controlled oscillator generates an output pulse signal with a frequency which varies according to a control voltage. The 1/n frequency demultiplier outputs a feedback signal which is generated by demultiplying the output pulse signal by n. The phase comparator is supplied with a first signal which varies according to a reference clock signal and a second signal which varies according to the feedback signal, executes phase comparison between the two signals, and controls the oscillation frequency of the voltage controlled oscillator by varying the control voltage by outputting an up-control signal or a down-control signal depending on phase difference between the first signal and the second signal. And the modulation circuit generates the first signal by periodically executing modulation to the reference clock signal, and supplies the phase comparator with the first signal.

Preferably, the modulation circuit executes the modulation by shifting edges of the reference clock signal at intervals of the cycle time of the reference clock signal multiplied by m (m: an even number larger than 0), by predetermined shift width which is larger than the dead zone width around phase difference zero of the phase comparator.

Preferably, the modulation circuit executes the modulation at intervals of twice the cycle time of the reference clock signal.

Preferably, the modulation circuit includes a delay circuit for outputting a delayed signal by delaying the reference clock signal by predetermined time, a counter circuit for alternately outputting two values driven by the delayed signal supplied from the delay circuit, and a selector circuit for selecting and outputting one of the reference clock signal and the delayed signal according to the value of the counter circuit.

Preferably, the predetermined time is set longer than the dead zone width around phase difference zero of the phase comparator.

Preferably, the phase locked loop further comprises a loop filter for outputting a voltage which varies according to an electric charge stored in itself as the control voltage, and a charge pump circuit for charging and discharging the electric charge stored in the loop filter according to the up-control signal and the down-control signal supplied from the phase comparator.

Preferably, the phase locked loop further comprises a 1/n delay circuit between the 1/n frequency demultiplier and the phase frequency comparator, for delaying the feedback signal by half the shift width of the modulation of the modulation circuit.

In accordance with another aspect of the present invention, there is provided a phase locked loop comprising a voltage controlled oscillator, a 1/n frequency demultiplier, a phase comparator, and a modulation circuit. The voltage controlled oscillator generates an output pulse signal with a frequency which varies according to a control voltage. The 1/n frequency demultiplier outputs a feedback signal which is generated by demultiplying the output pulse signal by n. The phase comparator is supplied with a first signal which varies according to a reference clock signal and a second signal which varies according to the feedback signal, executes phase comparison between the two signals, and controls the oscillation frequency of the voltage controlled oscillator by varying the control voltage by outputting an up-control signal or a down-control signal depending on phase difference between the first signal and the second signal. The modulation circuit generates the second signal by periodically executing modulation to the feedback signal, and supplies the phase comparator with the second signal.

Preferably, the modulation circuit executes the modulation by shifting edges of the feedback signal at intervals of the cycle time of the feedback signal multiplied by m (m: an even number larger than 0), by predetermined shift width which is larger than the dead zone width around phase difference zero of the phase comparator.

Preferably, the modulation circuit executes the modulation at intervals of twice the cycle time of the feedback signal.

Preferably, the modulation circuit includes a delay circuit for outputting a delayed signal by delaying the feedback signal by predetermined time, a counter circuit for alternately outputting two values driven by the delayed signal supplied from the delay circuit, and a selector circuit for selecting and outputting one of the feedback signal and the delayed signal according to the value of the counter circuit.

Preferably, the predetermined time is set longer than the dead zone width around phase difference zero of the phase comparator.

Preferably, the phase locked loop further comprises a loop filter for outputting a voltage which varies according to an electric charge stored in itself as the control voltage, and a charge pump circuit for charging and discharging the electric charge stored in the loop filter according to the up-control signal and the down-control signal supplied from the phase comparator.

Preferably, the phase locked loop further comprises a 1/n delay circuit before the phase frequency comparator, for delaying the reference clock signal by half the shift width of the modulation of the modulation circuit.

BRIEF DESCRIPTION OF THE DRAWINGS

The objects and features of the present invention will become more apparent from the consideration of the following detailed description taken in conjunction with the accompanying drawings, in which:

FIG. 10 is a block diagram showing composition of a phase locked loop according to the third embodiment of the present invention;

DESCRIPTION OF THE PREFERRED EMBODIMENTS

Figure 1:
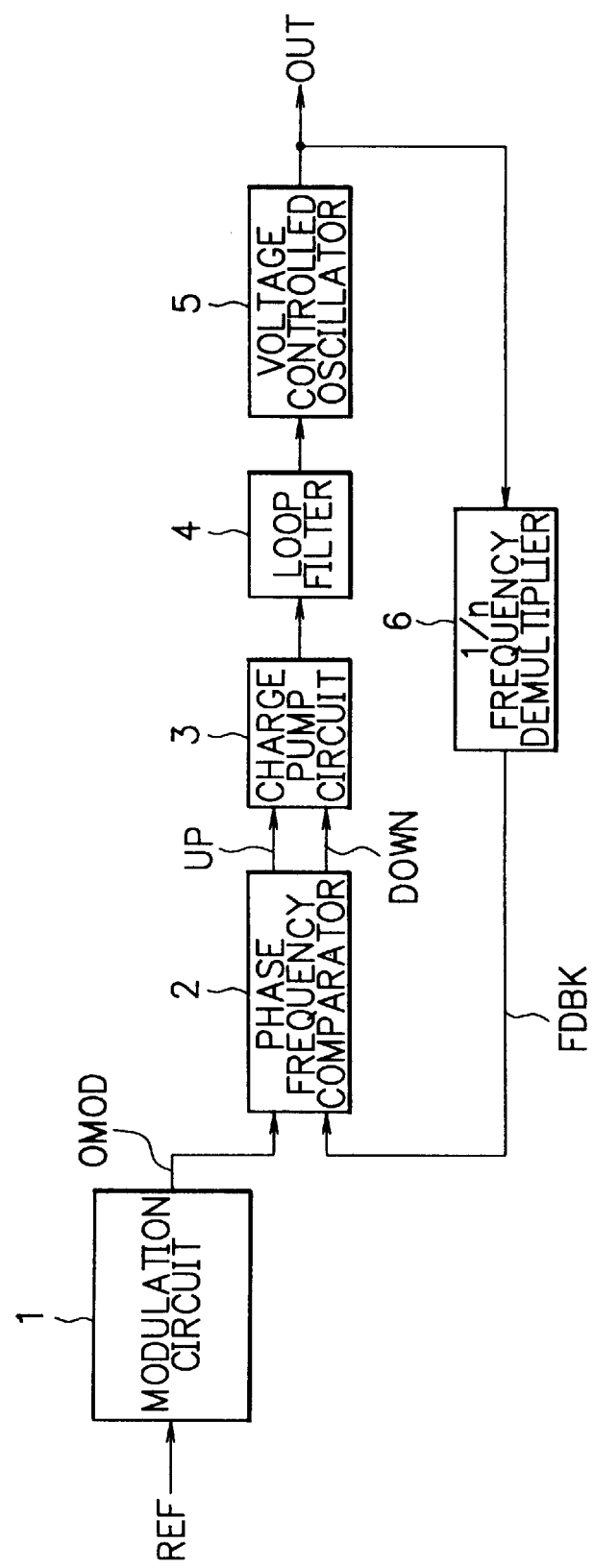
FIG. 1 is a block diagram showing composition of a phase locked loop according to the first embodiment of the present invention.

Referring now to the drawings, a description will be given in detail of preferred embodiments in accordance with the present invention.

FIG. 1 is a block diagram showing composition of a phase locked loop according to an embodiment of the present invention. The phase locked loop comprises a modulation circuit 1, an edge comparison type phase frequency comparator (PFC) 2, a charge pump circuit (CP) 3, a loop filter or a low pass filter (LPF) 4, a voltage controlled oscillator (VCO) 5, and a 1/n frequency demultiplier 6.

Figure 2:
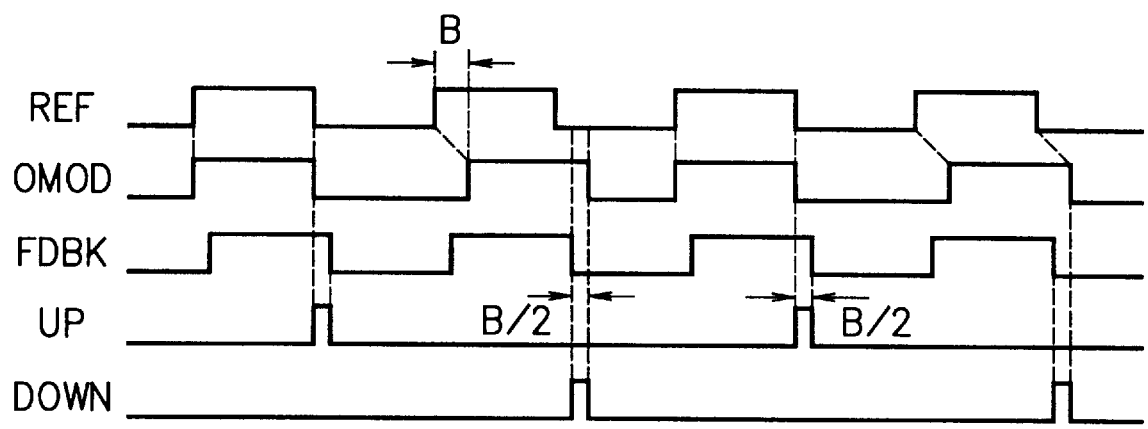
FIG. 2 is a timing chart showing variations of signals in the phase locked loop of FIG. 1.
Figure 3:
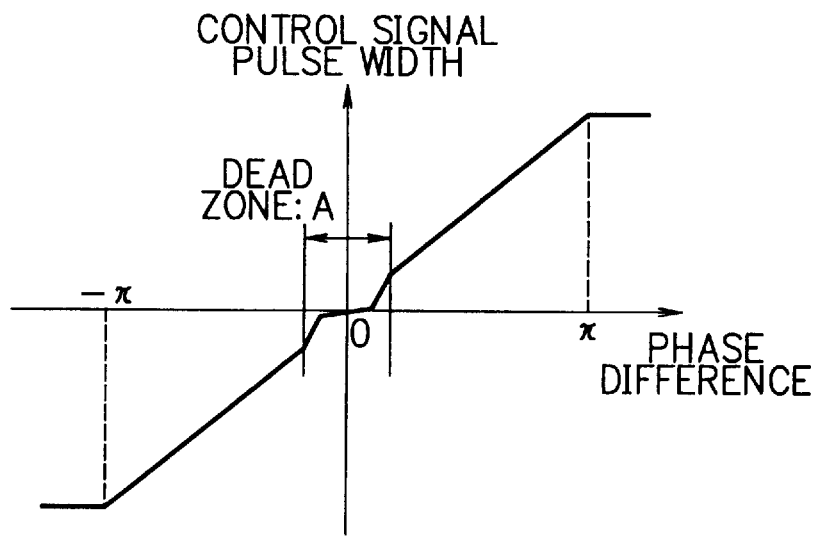
FIG. 3 is a graph showing relation between phase difference of input signals to a phase frequency comparator and pulse width of a control signal outputted by the phase frequency comparator.

The modulation circuit 1 receives a reference clock signal REF, generates a modulated output signal OMOD by modulating the reference clock signal REF, and supplies the modulated output signal OMOD to the phase frequency comparator 2. FIG. 2 is a timing chart showing variations of signals in the phase locked loop of FIG. 1. In the modulation circuit 1, the modulation of the reference clock signal REF is executed at intervals of the cycle time of the signal REF multiplied by m, as shown in FIG. 2. Here, m is an even number larger than 0, and hereafter, the case where m=2 will be described. The shift widths of the rising edge and the falling edge are set larger than 'dead zone width' of the phase frequency comparator 2 which is placed next to the modulation circuit 1. The phase frequency comparator 2 involves a 'dead zone' around phase difference zero. FIG. 3 is showing relation between phase difference of input signals to the phase frequency comparator 2 and pulse width of a control signal outputted by the phase frequency comparator 2. As shown in FIG. 3, around the phase difference=0, the dead zone A exists due to response delay etc. of circuit elements composing the phase frequency comparator 2. In the stationary state where the phase locked loop is phase locked, the phase locked loop operates around the phase difference=0.

The phase frequency comparator 2 is supplied with the modulated output signal OMOD from the modulation circuit 1 and a feedback signal FDBK from the 1/n frequency demultiplier 6. The phase frequency comparator 2 executes phase comparison between the two input signals using edges of the signals, and outputs an up-control signal UP or a down-control signal DOWN depending on the phase difference between the input signals. If the frequency of the feedback signal FDBK is lower than the frequency of the modulated output signal OMOD, i.e. if the edge of the feedback signal FDBK comes later than the edge of the modulated output signal ONIOD, the phase frequency comparator 2 outputs the up-control signal UP which has a pulse width equal to the phase difference between the two input signals, and if the frequency of the feedback signal FDBK is higher, i.e. if the edge of the feedback signal FDBK comes faster, the phase frequency comparator 2 outputs the down-control signal DOWN which has a pulse width equal to the phase difference between the two input signals.

The charge pump circuit 3 is supplied with the up-control signal UP or the down-control signal DOWN from the phase frequency comparator 2, and charges or discharges an electric charge which is stored in the loop filter 4, according to the supply of the signal UP or the signal DOWN. The loop filter 4 may be composed of a loop filter of lag-lead type. The charge pump circuit 3 executes charging if the up-control signal UP is supplied, and executes discharging if the down-control signal DOWN is supplied, to the extent according to the pulse width of the signal.

The loop filter 4 outputs a control voltage according to the amount of the electric charge stored in itself which is charged or discharged by the charge pump circuit 3.

The voltage controlled oscillator 5 outputs a frequency multiplied clock signal OUT and varies its oscillation frequency according to the control voltage supplied from the loop filter 4. The frequency of the frequency multiplied clock signal OUT controlled by the control voltage varies around a frequency which is n times the frequency of the reference clock signal REF.

The 1/n frequency demultiplier 6 is supplied with the frequency multiplied clock signal OUT from the voltage controlled oscillator 5, and outputs the feedback signal FDBK to the phase frequency comparator 2 by demultiplying the frequency multiplied clock signal OUT by n.

In the following, the operation of the phase locked loop of the first embodiment will be described referring to FIG. 1 and FIG. 2.

In FIG. 1, the edges of the reference clock signal REF are modulated or shifted by the modulation circuit 1 at intervals of twice the cycle time of the signal REF, by the shift width B which is larger than the dead zone width A of the phase frequency comparator 2, as shown in FIG. 2. The modulated output signal ONIOD generated by the modulation circuit 1 is supplied to one input terminal of the phase frequency comparator 2. The other input terminal of the phase frequency comparator 2 is supplied with the feedback signal FDBK which has been generated by the 1/n frequency demultiplier 6 by demultiplying the frequency multiplied clock signal OUT outputted by the voltage controlled oscillator 5 by n.

Incidentally, the phase frequency comparator 2 is a phase frequency comparator of edge comparison type, and executes phase comparison between the modulated output signal OMOD and the feedback signal FDBK using falling edges of the signals and outputs the up-control signal UP or the down-control signal DOWN whose pulse width is equal to the phase difference between the two input signals, as shown in FIG. 2. However, it is of course as well possible to compose an equivalent phase locked loop in which the phase frequency comparator 2 uses rising edges of the two input signals.

In the stationary state where the phase locked loop is phase locked, the phase difference between an edge of the modulated output signal ONIOD and a corresponding edge of the feedback signal FDBK is larger than the dead zone width A of the phase frequency comparator 2. Therefore, the phase frequency comparator 2 always executes phase comparison in zones outside the dead zone shown in FIG. 2, and consequently, the up-control signal UP and the down-control signal DOWN of approximately the same pulse widths are alternately outputted by the phase frequency comparator 2 as control signals for the charge pump circuit 3. Incidentally, in the case where the number m is 4, two up-control signals UP and two down-control signals DOWN are outputted alternately.

Figure 4:
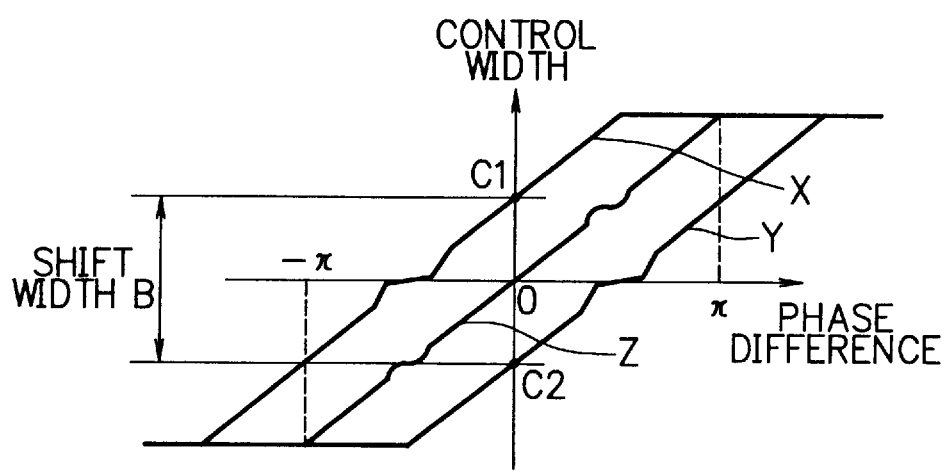
FIG. 4 is a graph showing control of frequency of the output of the phase locked loop of FIG. 1 in which a modulation circuit and a phase frequency comparator are coupled together.

FIG. 4 is a graph showing control of the frequency of the frequency multiplied clock signal OUT by the phase locked loop in which the modulation circuit 1 and the phase frequency comparator 2 are coupled together. Due to the aforementioned modulation executed by the modulation circuit 1, output of the phase frequency comparator 2 alternately varies between the line X and the line Y in FIG. 4. Therefore, output of the loop filter (low pass filter) 4 is described as the line Z in FIG. 4, which is the average of the line X and the line Y. For example, when the phase locked loop is perfectly phase locked (phase difference=0), output of the phase frequency comparator 2 alternately varies between the point C1 and the point C2 in FIG. 4, that is, the phase frequency comparator 2 outputs the up-control signal UP of a pulse width of B/2 and the down-control signal DOWN of a pulse width of B/2, alternately. And the loop filter (low pass filter) 4 varies its control voltage by 0, which is the average of (+B/2) and (--B/2).

As shown by the line X and the line Y in FIG. 4, the phase frequency comparator 2 is made to execute phase comparison in its linear zones, i.e. outside the dead zone. Therefore, around the stationary state, control of the oscillation frequency of the voltage controlled oscillator 5 by the loop filter 4 is always executed in the perfectly linear zone on the line Z, with no effects of the dead zone of the phase frequency comparator 2, and the phase locked loop operates with perfectly linear characteristic as shown by the line Z in FIG. 4, as if no dead zone of the phase frequency comparator 2 around the phase difference zero exists.

Figure 5:
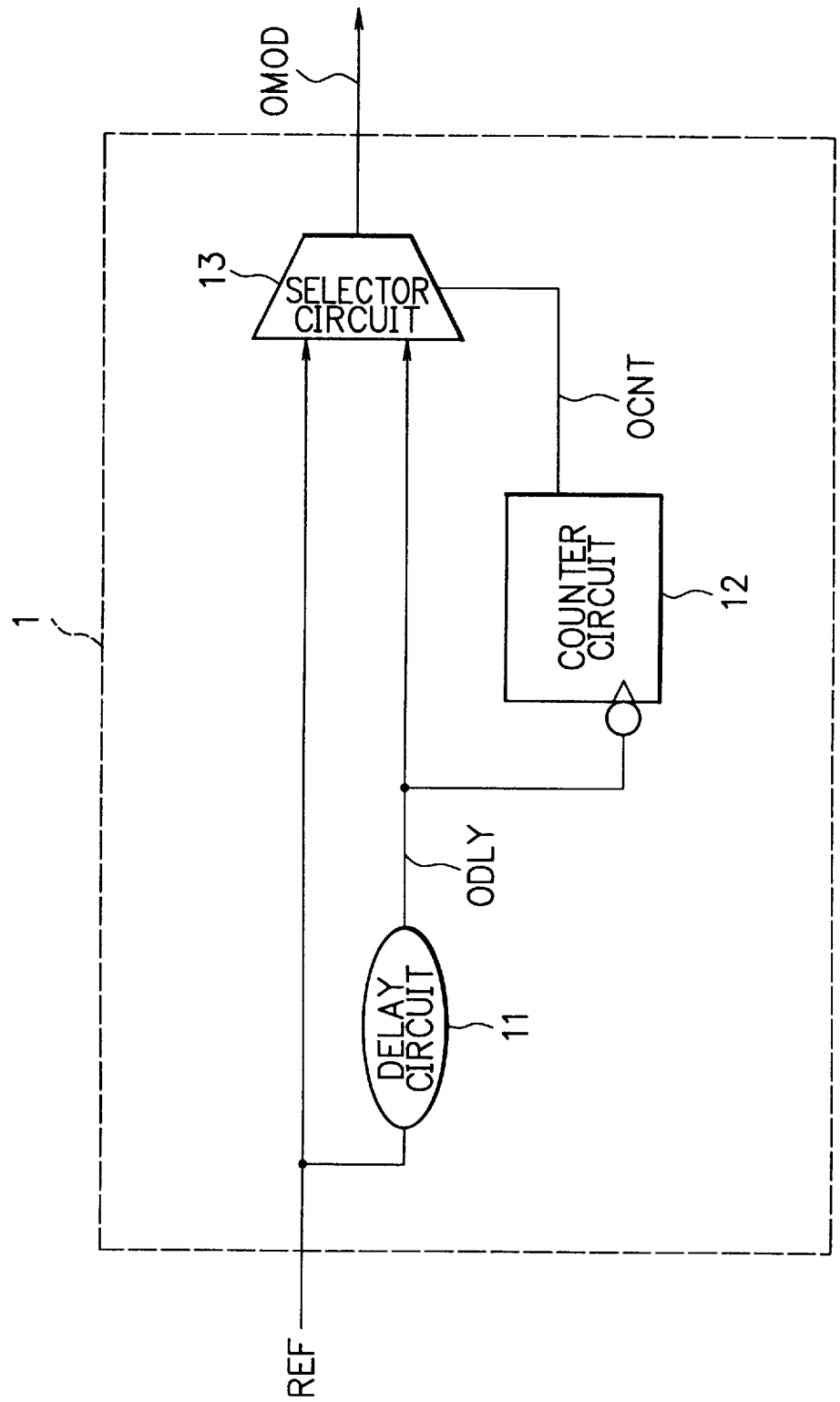
FIG. 5 is a block diagram showing an example of composition of the modulation circuit.
Figure 7:
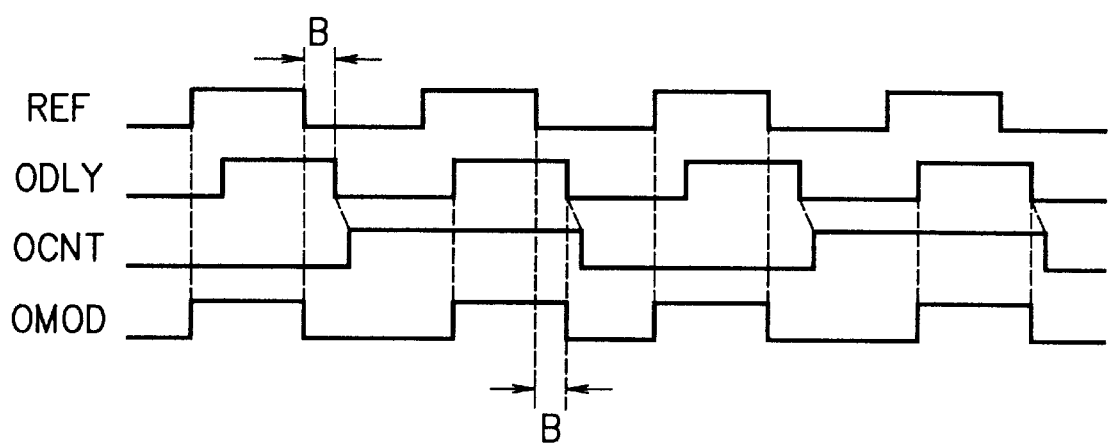
FIG. 7 is a timing chart showing variations of signals in the modulation circuit shown in FIG. 5.

FIG. 5 is a block diagram showing an example of composition of the modulation circuit 1, and FIG. 7 is a timing chart showing variations of signals in the modulation circuit 1 shown in FIG. 5. The modulation circuit 1 shown in FIG. 5 comprises a delay circuit 11, a counter circuit 12, and a selector circuit 13.

The delay circuit 11 is supplied with the reference clock signal REF and delays the signal REF by time longer than the dead zone width of the phase frequency comparator 2, and outputs a delayed signal ODLY.

The counter circuit 12 is supplied with the delayed signal ODLY from the delay circuit 11 and outputs a count signal OCNT which alternately varies its value between '0' and '1' according to falling edge of the delayed signal ODLY as shown in FIG. 7.

The selector circuit 13 is supplied with the reference clock signal REF and the delayed signal ODLY from the delay circuit 11, and outputs either of the two input signals as the modulated output signal OMOD, according to the value '0' or '1' of the count signal OCNT supplied from the counter circuit 12. The selector circuit 13 outputs the reference clock signal REF when the value of the count signal OCNT is '0', and outputs the delayed signal ODLY when the value of the count signal OCNT is '1', as the modulated output signal OMOD. Incidentally, it is as well possible for the selector circuit 13 to output the reference clock signal REF when the value of the count signal OCNT is '1', and output the delayed signal ODLY when the value of the count signal OCNT is '0', as the modulated output signal OMOD.

Figure 6:
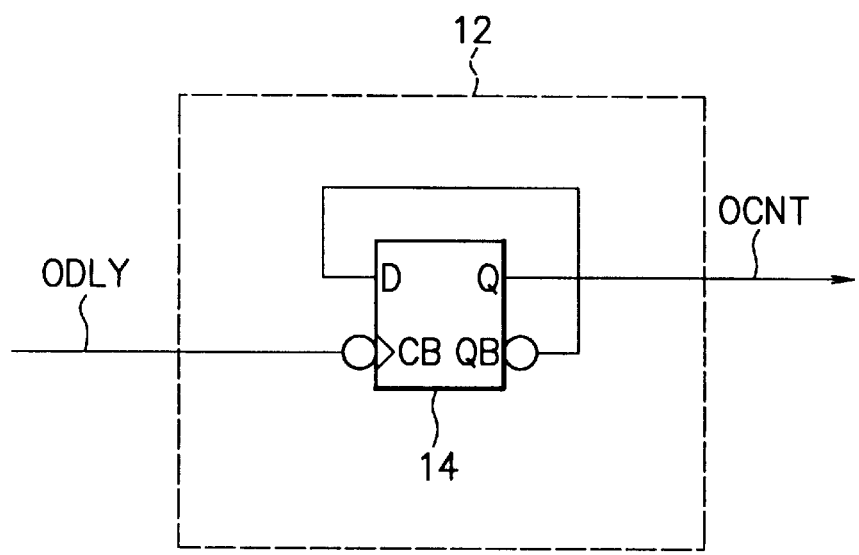
FIG. 6 is a circuit diagram showing an example of a counter circuit shown in FIG. 5.

FIG. 6 is a circuit diagram showing an example of the counter circuit 12. The counter circuit 12 shown in FIG. 6 is composed of a flip-flop 14. The clock terminal CB of the flip-flop 14 is supplied with falling edges of the delayed signal ODLY from the delay circuit 11 as clock signals. Inverted output of the flip-flop 14 is fed back to the data terminal D of the flip-flop 14, and non-inverted output of the flip-flop 14 is outputted as the count signal OCNT, in which the flip-flop 14 repeats inversion of the count signal OCNT according to the supply of the falling edges of the delayed signal ODLY to its clock terminal CB.

Referring to FIG. 5 and FIG. 7, the reference clock signal REF and the delayed signal ODLY which has been delayed by the delay circuit 11 by the time longer than the dead zone width A of the phase frequency comparator 2 as shown in FIG. 7 are inputted into the selector circuit 13. From the counter circuit 12, the count signal OCNT, which alternately varies its value between '0' and '1' according to supply of falling edges of the delayed signal ODLY, is supplied to the selector circuit 13. In the selector circuit 13, the reference clock signal REF is selected when the count signal OCNT is '0' and the delayed signal ODLY is selected when the count signal OCNT is '1', and the selected signal is outputted as the modulated output signal OMOD. As shown in FIG. 7, in the modulated output signal OMOD, edges of the reference clock signal REF are modulated or shifted at intervals of twice the cycle time of the signal REF, by the shift width B which is larger than the dead zone width A of the phase frequency comparator 2. The modulated output signal ONIOD is supplied to one input terminal of the phase frequency comparator 2, and the other input terminal of the phase frequency comparator 2 is supplied with the feedback signal FDBK which has been generated by the 1/n frequency demultiplier 6 by demultiplying the frequency multiplied clock signal OUT outputted by the voltage controlled oscillator 5 by n.

As shown above, according to the embodiment, due to the modulation executed by the modulation circuit 1, which is larger than the dead zone width A of the phase frequency comparator 2, it is made possible for the phase locked loop to operate with perfectly linear characteristic around the stationary state, equivalently to an ideal phase locked loop provided with a phase frequency comparator having no dead zone around the phase difference zero.

Figure 8:
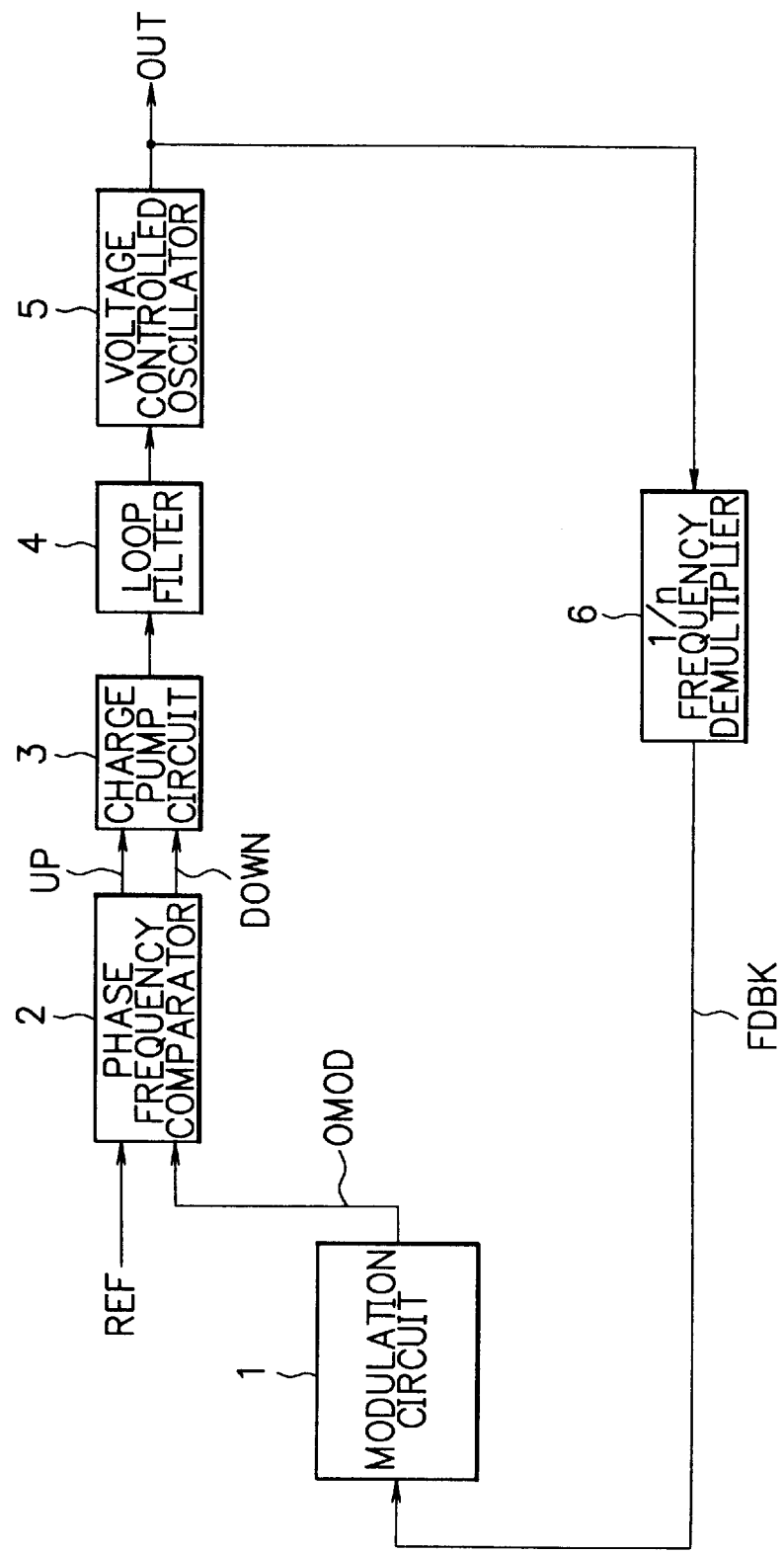
FIG. 8 is a block diagram showing composition of a phase locked loop according to the second embodiment of the present invention.
Figure 9:
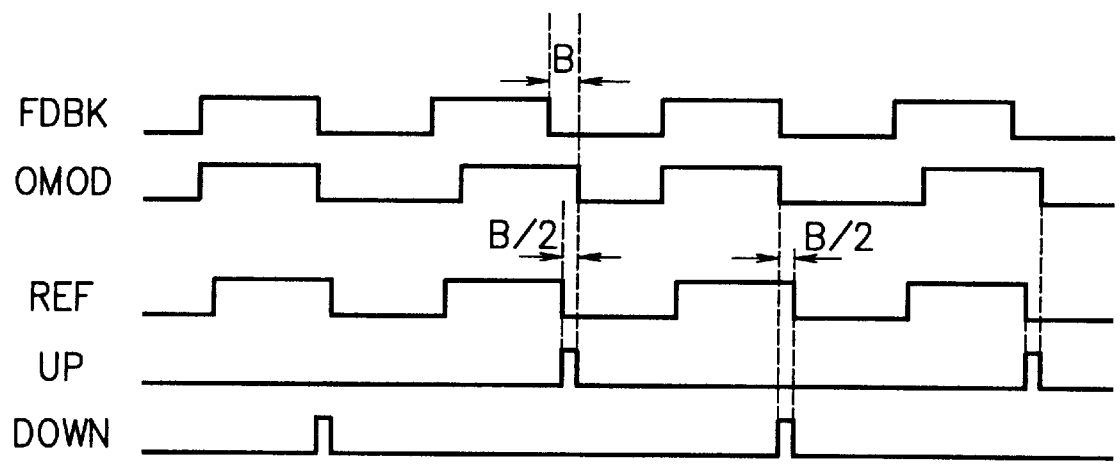
FIG. 9 is a timing chart showing variations of signals in the phase locked loop of FIG. 8.

FIG. 8 is a block diagram showing composition of a phase locked loop according to another embodiment of the present invention. FIG. 9 is a timing chart showing variations of signals in the phase locked loop of FIG. 8. The phase locked loop of the second embodiment comprises the modulation circuit 1, the edge comparison type phase frequency comparator (PFC) 2, the charge pump circuit (CP) 3, the loop filter 4, the voltage controlled oscillator (VCO) 5, and the 1/n frequency demultiplier 6, similarly to the first embodiment. Each component is fundamentally the same as that of the first embodiment, and thus repeated description thereof is omitted for brevity.

In the second embodiment, the reference clock signal REF is directly supplied to one input terminal of the phase frequency comparator 2, and the modulation circuit 1 which is supplied with the feedback signal FDBK is connected to another input terminal of the phase frequency comparator 2.

In the following, the operation of the phase locked loop of the second embodiment will be described referring to FIG. 8 and FIG. 9.

The modulation circuit 1 is supplied with the feedback signal FDBK from the 1/n frequency demultiplier 6 (n is an integer larger than 0) and generates a modulated output signal OMOD by modulating or shifting edges of the feedback signal FDBK at intervals of twice the cycle time of the feedback signal FDBK, by the shift width B which is larger than the dead zone width A of the phase frequency comparator 2. The modulated output signal OMOD is supplied to one input terminal of the phase frequency comparator 2. Incidentally, the modulation circuit 1 of the second embodiment can be realized by the same composition as that of the modulation circuit 1 in the first embodiment as shown in FIG. 5 and FIG. 6.

The phase frequency comparator 2 is supplied with the reference clock signal REF and the modulated output signal OMOD supplied from the modulation circuit 1. The phase frequency comparator 2 executes phase comparison between the two input signals using edges of the signals, and outputs the up-control signal UP or the down-control signal DOWN depending on the phase difference between the input signals as shown in FIG. 9, in which the up-control signal UP which has a pulse width equal to the phase difference between the two input signals is outputted if the frequency of the modulated output signal OMOD is lower than the frequency of the reference clock signal REP, i.e. if the edge of the modulated output signal OMOD comes later than the edge of the reference clock signal REF, and if the frequency of the modulated output signal OMOD is higher, i.e. if the edge of the modulated output signal OMOD comes faster, the down-control signal DOWN which has a pulse width equal to the phase difference between the two input signals is outputted.

The charge pump circuit 3 is supplied with the up-control signal UP or the down-control signal DOWN from the phase frequency comparator 2. The charge pump circuit 3 charges an electric charge which is stored in the loop filter 4 according to supply of the up-control signal UP and discharges the electric charge according to supply of the down-control signal DOWN, to the extent according to the pulse width of the signal. The loop filter 4 outputs a control voltage according to the amount of the electric charge stored in itself which is charged or discharged by the charge pump circuit 3. The voltage controlled oscillator 5 outputs a frequency multiplied clock signal OUT and varies its oscillation frequency according to the control voltage supplied from the loop filter 4. The 1/n frequency demultiplier 6 is supplied with the frequency multiplied clock signal OUT from the voltage controlled oscillator 5, and outputs the feedback signal FDBK to the modulation circuit 1 by demultiplying the frequency multiplied clock signal OUT by n.

Consequently, similarly to the first embodiment, due to the modulation executed by the modulation circuit 1, which is larger than the dead zone width A of the phase frequency comparator 2, the phase frequency comparator 2 is made to execute phase comparison in its linear zones, i.e. outside the dead zone, and it is made possible for the phase locked loop to operate with perfectly linear characteristic around the stationary state, equivalently to an ideal phase locked loop provided with a phase frequency comparator without dead zone around the phase difference zero.

Figure 11:
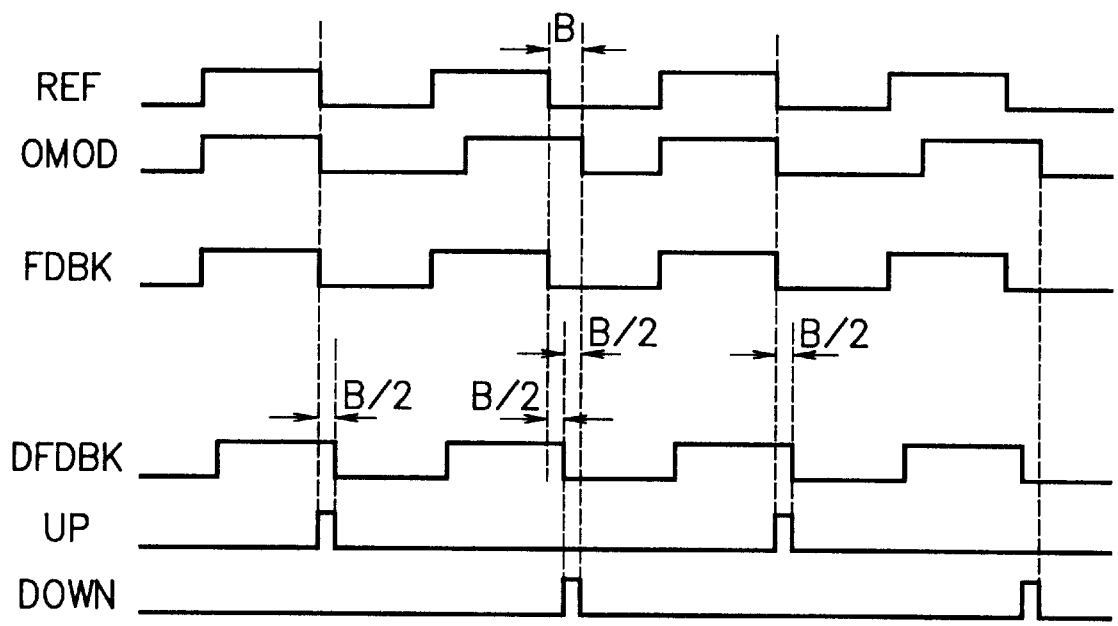
FIG. 11 is a timing chart showing variations of signals in the phase locked loop of FIG. 10.

FIG. 10 is a block diagram showing composition of a phase locked loop according to the third embodiment of the present invention, and FIG. 11 is a timing chart showing variations of signals in the phase locked loop of FIG. 10. The phase locked loop of FIG. 10 has almost the same composition as the phase locked loop of FIG. 1, except that a ½ delay circuit 7 is placed between the 1/n frequency demultiplier 6 and the phase frequency comparator 2. The phase locked loop of FIG. 1 could eliminate jitters due to the dead zone of the phase frequency comparator 2, however, the output of the phase locked loop (i.e. the frequency multiplied clock signal OUT) or the feedback signal FDBK is necessitated to be delayed B/2 than the reference clock signal REF as shown in FIG. 2. In other words, stationary phase difference exists and perfect synchronization between the reference clock signal REF and the frequency multiplied clock signal OUT is impossible in the phase locked loop of FIG. 1. In this embodiment, the ½ delay circuit 7 is provided between the 1/n frequency demultiplier 6 and the phase frequency comparator 2 in order to eliminate the stationary phase difference.

In the following, the operation of the phase locked loop of the third embodiment will be described referring to FIG. 10 and FIG. 11.

The operations of components other than the ½ delay circuit 7 and the phase frequency comparator 2 are the same as those of the first embodiment, and thus repeated description thereof is omitted for brevity. The ½ delay circuit 7 is supplied with the feedback signal FDBK from the 1/n frequency demultiplier 6 and delays the feedback signal FDBK by half the shift width B of the modulation circuit 1. The delayed feedback signal DFDBK is supplied to one input terminal of the phase frequency comparator 2. The phase frequency comparator 2 is supplied with the modulated output signal OMOD from the modulation circuit 1 and the delayed feedback signal DFDBK from the ½ delay circuit 7, executes phase comparison between the two input signals using edges of the signals, and outputs an up-control signal UP or a down-control signal DOWN depending on the phase difference between the input signals as shown in FIG. 11, in which the up-control signal UP which has a pulse width equal to the phase difference between the two input signals is outputted if the frequency of the delayed feedback signal DFDBK is lower than the frequency of the modulated output signal OMOD, i.e. if the edge of the delayed feedback signal DFDBK comes later than the edge of the modulated output signal OMOD, and if the frequency of the delayed feedback signal DFDBK is higher, i.e. if the edge of the delayed feedback signal DFDBK comes faster, the down-control signal DOWN which has a pulse width equal to the phase difference between the two input signals is outputted.

Referring to FIG. 11, the feedback signal FDBK has the same pulse phase with the reference clock signal REF in the stationary state. In other words, output of the phase locked loop (i.e. the frequency multiplied clock signal OUT) varies perfectly synchronized with the reference clock signal REF, that is, the stationary phase difference is eliminated in the phase locked loop of FIG. 10.

As shown above, according to the third embodiment, along with the perfectly linear characteristic around the stationary state which is realized by the phase locked loop of FIG. 1, elimination of the stationary phase difference is realized by the ½ delay circuit 7 which is placed between the 1/n frequency demultiplier 6 and the phase frequency comparator 2.

Incidentally, elimination of the stationary phase difference is easily and correctly executed in this embodiment. For example, in the case where the delay circuit 11 in the modulation circuit 1 is composed of 2K pieces of inverter gates connected in series, the ½ delay circuit 7 can easily be formed of k pieces of inverter gates connected in series.

Figure 12:
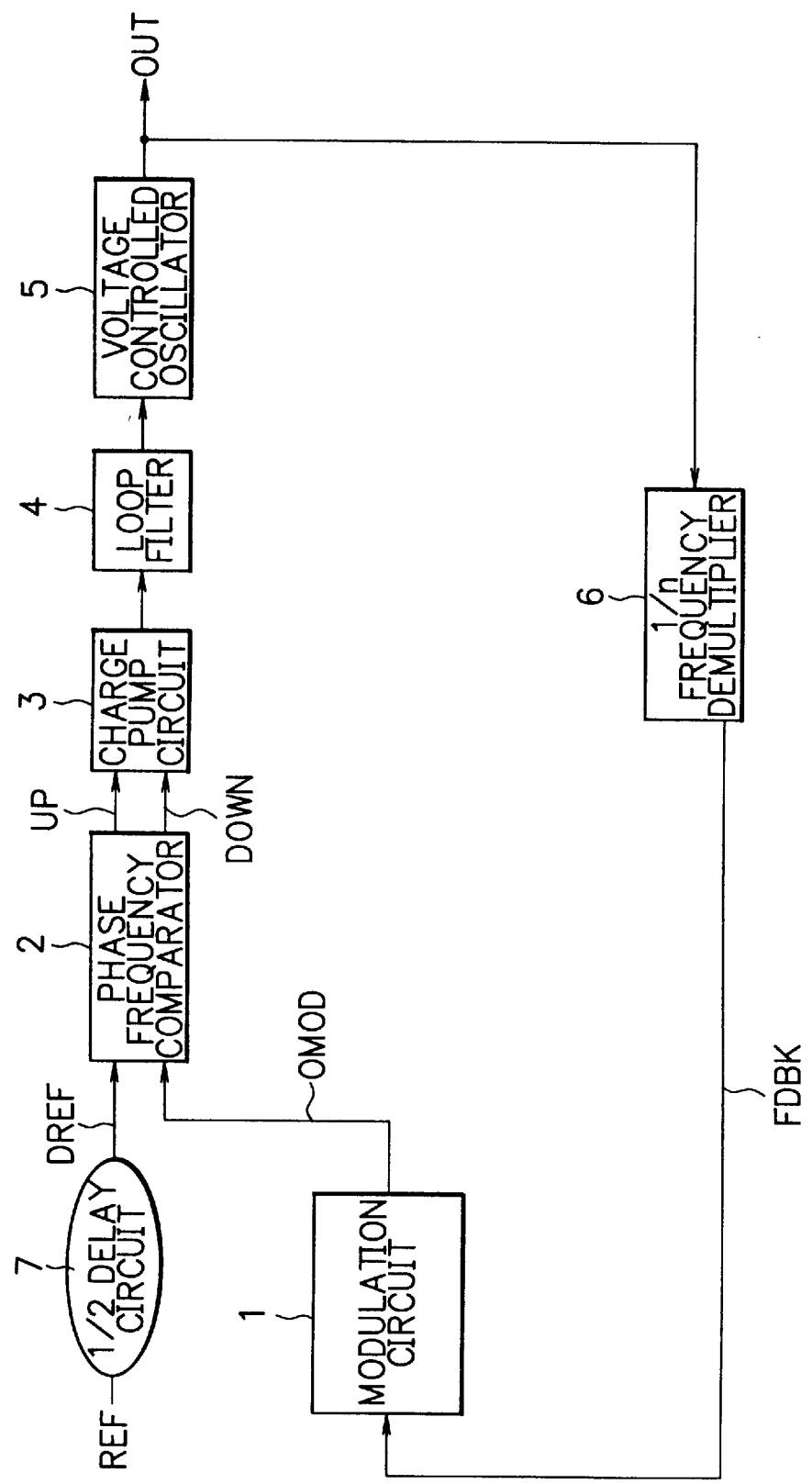
FIG. 12 is a block diagram showing composition of a phase locked loop according to the fourth embodiment of the present invention.
Figure 13:
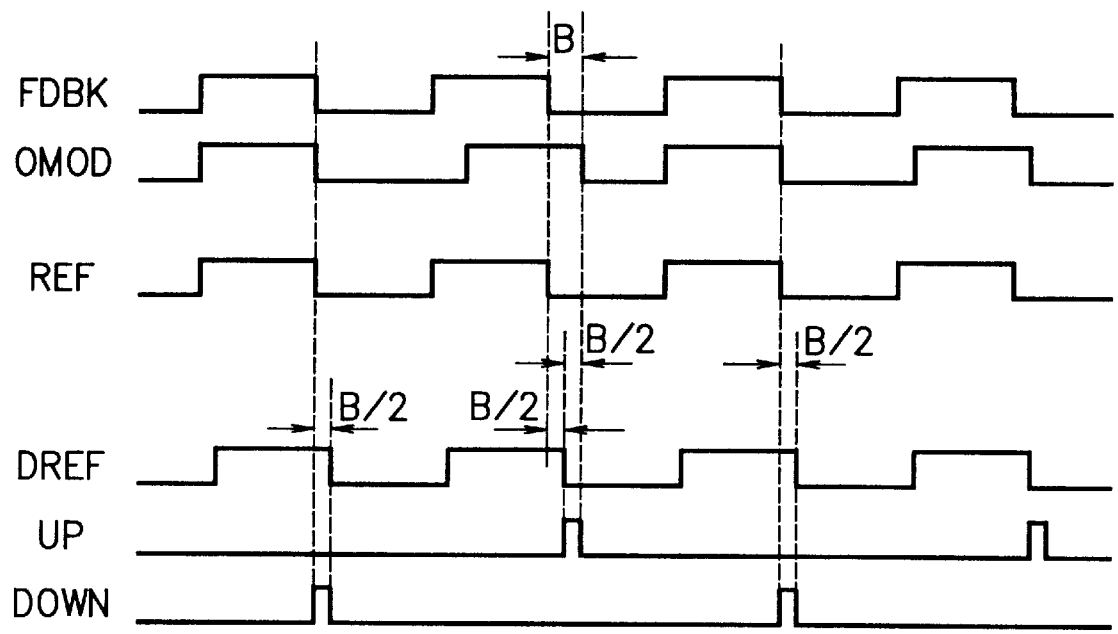
FIG. 13 is a timing chart showing variations of signals in the phase locked loop of FIG. 12.

FIG. 12 is a block diagram showing composition of a phase locked loop according to the fourth embodiment of the present invention, and FIG. 13 is a timing chart showing variations of signals in the phase locked loop of FIG. 12. The phase locked loop of FIG. 12 has almost the same composition as the phase locked loop of FIG. 8, except that a ½ delay circuit 7 is placed before the phase frequency comparator 2. The phase locked loop of FIG. 8 could eliminate jitters due to the dead zone of the phase frequency comparator 2, however, the output of the phase locked loop (i.e. the frequency multiplied clock signal OUT) or the feedback signal FDBK is necessitated to be faster than the reference clock signal REF by B/2 as shown in FIG. 9. In the fourth embodiment, the ½ delay circuit 7 is used in order to eliminate the stationary phase difference which is involved in the phase locked loop of the second embodiment.

In the following, the operation of the phase locked loop of the fourth embodiment will be described referring to FIG. 12 and FIG. 13.

The operations of components other than the ½ delay circuit 7 and the phase frequency comparator 2 are the same as those of the second embodiment, and thus repeated description thereof is omitted for brevity. The ½ delay circuit 7 is supplied with the reference clock signal REF and delays the signal REF by half the shift width B of the modulation circuit 1. The delayed reference clock signal DREF is supplied to one input terminal of the phase frequency comparator 2. The phase frequency comparator 2 is supplied with the delayed reference clock signal DREF from the ½ delay circuit 7 and the modulated output signal OMOD from the modulation circuit 1, and outputs an up-control signal UP or a down-control signal DOWN depending on the phase difference between the two input signals as shown in FIG. 13, in which the up-control signal UP which has a pulse width equal to the phase difference between the two input signals is outputted if the frequency of the modulated output signal OMOD is lower than the frequency of the delayed reference clock signal DREF, i.e. if the edge of the modulated output signal OMOD comes later than the edge of the delayed reference clock signal DREF, and if the frequency of the modulated output signal OMOD is higher, i.e. if the edge of the modulated output signal OMOD comes faster, the down-control signal DOWN which has a pulse width equal to the phase difference between the two input signals is outputted.

Referring to FIG. 13, the feedback signal FDBK has the same pulse phase with the reference clock signal REF in the stationary state, that is, the stationary phase difference is eliminated in the phase locked loop of FIG. 12.

As shown above, according to the fourth embodiment, along with the perfectly linear characteristic around the stationary state which is realized by the phase locked loop of FIG. 8, elimination of the stationary phase difference is realized by the ½ delay circuit 7 which is placed before the phase frequency comparator 2.

As set forth hereinabove, in the phase locked loop according to the present invention, effective avoidance of the output jitters due to the dead zone of the phase comparator, along with elimination of the stationary phase difference is realized.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A phase locked loop comprising:

a voltage controlled oscillator for generating an output pulse signal with a frequency which varies according to a control voltage;

a 1/n frequency demultiplier for outputting a feedback signal which is generated by demultiplying the output pulse signal by n;

a phase comparator for being supplied with a first signal which varies according to a reference clock signal and a second signal which varies according to the feedback signal, executing phase comparison between the two signals, and controlling the oscillation frequency of the voltage controlled oscillator by varying the control voltage by outputting an up-control signal or a down-control signal depending on phase difference between the first signal and the second signal; and a modulation circuit for generating the first signal by periodically executing modulation to the reference clock signal, and supplying the phase comparator with the first signal.

2. A phase locked loop as claimed in claim 1, wherein the modulation circuit executes the modulation by shifting edges of the reference clock signal at intervals of the cycle time of the reference clock signal multiplied by m (m: an even number larger than 0), by predetermined shift width which is larger than the dead zone width around phase difference zero of the phase comparator.

3. A phase locked loop as claimed in claim 2, wherein the modulation circuit executes the modulation at intervals of twice the cycle time of the reference clock signal.

4. A phase locked loop as claimed in claim 1, wherein the modulation circuit includes:

a delay circuit for outputting a delayed signal by delaying the reference clock signal by predetermined time:

a counter circuit for alternately outputting two values driven by the delayed signal supplied from the delay circuit; and a selector circuit for selecting and outputting one of the reference clock signal and the delayed signal, according to the value of the counter circuit.

5. A phase locked loop as claimed in claim 4, wherein the predetermined time is set longer than the dead zone width around phase difference zero of the phase comparator.

6. A phase locked loop as claimed in claim 1, further comprising:

a loop filter for outputting a voltage which varies according to an electric charge stored in itself as the control voltage; and a charge pump circuit for charging and discharging the electric charge stored in the loop filter according to the up-control signal and the down-control signal supplied from the phase comparator.

7. A phase locked loop as claimed in claim 1, further comprising a ½ delay circuit between the 1/n frequency demultiplier and the phase frequency comparator, for delaying the feedback signal by half the shift width of the modulation of the modulation circuit.

8. A phase locked loop comprising:

a voltage controlled oscillator for generating an output pulse signal with a frequency which varies according to a control voltage;

a 1/n frequency demultiplier for outputting a feedback signal which is generated by demultiplying the output pulse signal by n;

a phase comparator for being supplied with a first signal which varies according to a reference clock signal and a second signal which varies according to the feedback signal, executing phase comparison between the two signals, and controlling the oscillation frequency of the voltage controlled oscillator by varying the control voltage by outputting an up-control signal or a down-control signal depending on phase difference between the first signal and the second signal; and a modulation circuit for generating the second signal by periodically executing modulation to the feedback signal, and supplying the phase comparator with the second signal.

9. A phase locked loop as claimed in claim 8, wherein the modulation circuit executes the modulation by shifting edges of the feedback signal at intervals of the cycle time of the feedback signal multiplied by m (m: an even number larger than 0), by predetermined shift width which is larger than the dead zone width around phase difference zero of the phase comparator.

10. A phase locked loop as claimed in claim 9, wherein the modulation circuit executes the modulation at intervals of twice the cycle time of the feedback signal.

11. A phase locked loop as claimed in claim 8, wherein the modulation circuit includes:

a delay circuit for outputting a delayed signal by delaying the feedback signal by predetermined time:

a counter circuit for alternately outputting two values driven by the delayed signal supplied from the delay circuit; and a selector circuit for selecting and outputting one of the feedback signal and the delayed signal, according to the value of the counter circuit.

12. A phase locked loop as claimed in claim 11, wherein the predetermined time is set longer than the dead zone width around phase difference zero of the phase comparator.

13. A phase locked loop as claimed in claim 8, further comprising:

a loop filter for outputting a voltage which varies according to an electric charge stored in itself as the control voltage; and a charge pump circuit for charging and discharging the electric charge stored in the loop filter according to the up-control signal and the down-control signal supplied from the phase comparator.

14. A phase locked loop as claimed in claim 8, further comprising a ½ delay circuit before the phase frequency comparator, for delaying the reference clock signal by half the shift width of the modulation of the modulation circuit.

* * * * *

UNITED STATES PATENT AND TRADEMARK OFFICE
CERTIFICATE OF CORRECTION

PATENT NO. : 5,877,658

DATED : March 2, 1999

INVENTOR(S) : Mitsuo Baba

It is certified that error appears in the above-identified patent and that said Letters Patent is hereby corrected as shown below:

Column 5, Line 5 & 47: "ONIOD" should read --OMOD--

Column 6, Line 1: "ONIOD" should read --OMOD--

Signed and Sealed this

Twenty-seventh Day of June, 2000

Attest:

Q. TODD DICKINSON

Attesting Officer     Director of Patents and Trademarks